United States Patent
Tahara et al.

(10) Patent No.: US 9,475,427 B2
(45) Date of Patent: Oct. 25, 2016

(54) VEHICLE LIGHTING DEVICE

(71) Applicant: TOYOTA BOSHOKU KABUSHIKI KAISHA, Aichi-ken (JP)

(72) Inventors: Hiroyasu Tahara, Aichi-ken (JP); Kenji Kiyosawa, Aichi-ken (JP)

(73) Assignee: TOYOTA BOSHOKU KABUSHIKI KAISHA, Aichi-Ken (JP)

( * ) Notice: Subject to any disclaimer, the term of this patent is extended or adjusted under 35 U.S.C. 154(b) by 182 days.

(21) Appl. No.: 14/294,419

(22) Filed: Jun. 3, 2014

(65) Prior Publication Data

US 2014/0376253 A1 Dec. 25, 2014

(30) Foreign Application Priority Data

Jun. 19, 2013 (JP) ................................ 2013-128342
Jun. 19, 2013 (JP) ................................ 2013-128343

(51) Int. Cl.

| *F21V 23/04* | (2006.01) |
| *B60Q 3/02* | (2006.01) |
| *H03K 17/96* | (2006.01) |
| *H01G 5/011* | (2006.01) |

(52) U.S. Cl.
CPC ........... *B60Q 3/0296* (2013.01); *H03K 17/962* (2013.01); *H01G 5/011* (2013.01); *H03K 2217/960755* (2013.01)

(58) Field of Classification Search
CPC ............. B60Q 3/0296; H03K 17/962; H03K 2217/960755; H01G 5/011
See application file for complete search history.

(56) References Cited

U.S. PATENT DOCUMENTS

| 5,801,340 | A | * | 9/1998 | Peter | ....................... G01S 13/04 178/20.04 |
| 6,819,316 | B2 | * | 11/2004 | Schulz | ..................... G06F 3/044 178/18.01 |
| 8,449,156 | B2 | * | 5/2013 | Salter | .................... B60Q 3/0203 362/276 |
| 9,086,318 | B1 | * | 7/2015 | Baldwin | ................... G01J 1/04 |
| 2006/0245200 | A1 | * | 11/2006 | Kuwana | ............... B60Q 3/0296 362/488 |
| 2010/0110712 | A1 | * | 5/2010 | Ando | .................... B60Q 3/0296 362/520 |
| 2011/0057899 | A1 | * | 3/2011 | Sleeman | ................. G01L 1/146 345/174 |
| 2012/0032916 | A1 | * | 2/2012 | Enoki | ..................... G06F 3/044 345/174 |

FOREIGN PATENT DOCUMENTS

JP 2010-105588 5/2010

* cited by examiner

*Primary Examiner* — Peggy Neils
(74) *Attorney, Agent, or Firm* — Greenblum & Bernstein, P.L.C.

(57) ABSTRACT

A vehicle lighting device includes a light source, a light source housing, and a covering member. The light source housing holds the light source therein and has an opening. The covering member is attached to the light source housing so as to cover the opening of the light source housing and configured to pass light emitted by the light source therethrough. The covering member includes a transparent sheet portion and a cover portion. The sheet portion includes an electrode layer. The cover portion is welded to one of surfaces of the sheet portion by insert molding and arranged on the light source housing to cover the opening of the light source housing and a light exit surface of the light source such that a surface of the cover portion without the sheet portion faces the light source.

15 Claims, 9 Drawing Sheets

VEHICLE LIGHTING DEVICE

CROSS REFERENCE TO RELATED APPLICATION

This application claims priority from Japanese Patent Applications No. 2013-128342 filed on Jun. 19, 2013 and No. 2013-128343 fined on Jun. 19, 2013. The entire contents of the priority application are incorporated herein by reference.

TECHNICAL FIELD

The present disclosure relates to a vehicle lighting device.

BACKGROUND

In a known vehicle lighting device, electrodes are attached to a cover (a lighting lens) which covers a light source (a bulb). The electrodes are for detecting a capacitance. A variation in capacitance caused by an occupant of a vehicle when the occupant touches a surface of the cover is detected. The light source is controlled to turn on when the variation in capacitance is detected. Namely, the electrodes are included in a touch switch.

To attach such electrodes to the cover, a sheet including the electrodes may be attached to the back surface of the cover (a surface on a light source side) with an adhesive. In this case, the back surface of the cover needs to be flat.

This is because an adhesive force between the cover and the sheet is low if the back surface of the cover is not flat. Therefore, the attachment of the sheet to the cover is difficult. Furthermore, if the back surface of the cover is not flat, air is more likely to enter between the sheet and the back surface of the cover. As a result, the capacitance varies from region to region according to whether the region contains the air. Namely, the sensitivity of the touch switch is different from area to area. Therefore, the attachment of the electrodes to the cover is difficult if the back surface of the cover is not flat.

The cover described above may include a first electrode and a second electrode. The first electrode is a component of the touch switch and the second electrode is an electrode for absorbing electric noises. With the electrodes, the stability in operation of the touch switch can be improved.

The sheet including the first electrode and the second electrode may be attached to a surface of the cover with an adhesive.

A typical example of such a cover to which the sheet is attached includes a main wall portion and a peripheral wall portion. The main wall portion includes a main surface (a surface on a vehicle interior side) of the cover. The peripheral wall portion includes a side surface of the cover. The sheet may be attached to main wall portion. With this configuration, an occupant of the vehicle can turn on a light source by touching the main surface of the cover.

However, if two kinds of the electrodes (the first and the second electrodes) are arranged in the main wall portion, the electrodes may be seen as a pattern. If so, the main surface looks messy, that is, the quality in appearance may decrease.

The larger the area of the first electrode, which is for detecting capacitances, the higher the operability of the touch switch. If the first electrode and the second electrode are arranged in the main wall portion, the area of the first electrode needs to be reduced by the area of the second electrode. The reduction in the area of the first electrode is a problem to be solved.

SUMMARY

A vehicle lighting device includes a light source, a light source housing, and a covering member. The light housing holds the light source therein. The light source housing has an opening. The covering member is attached to the light source housing so as to cover the opening of the light source housing and configured to pass light emitted by the light source therethrough. The covering member includes a transparent sheet portion and a cover portion. The transparent sheet portion includes an electrode layer. The cover portion is welded to one of surfaces of the sheet portion by insert molding and arranged on the light source housing to cover the opening of the light source housing and a light exit surface of the light source such that a surface of the cover portion without the sheet portion faces the light source.

DETAILED DESCRIPTION

The technology described herein provides a vehicle lighting device including a covering member that covers a light source and to which an electrode of a touch switch is coupled even though the back surface of the covering member is not smooth. The technology described herein provides a vehicle lighting device including an electrode of a touch switch having a large area and having a high quality in appearance.

Figure 1:
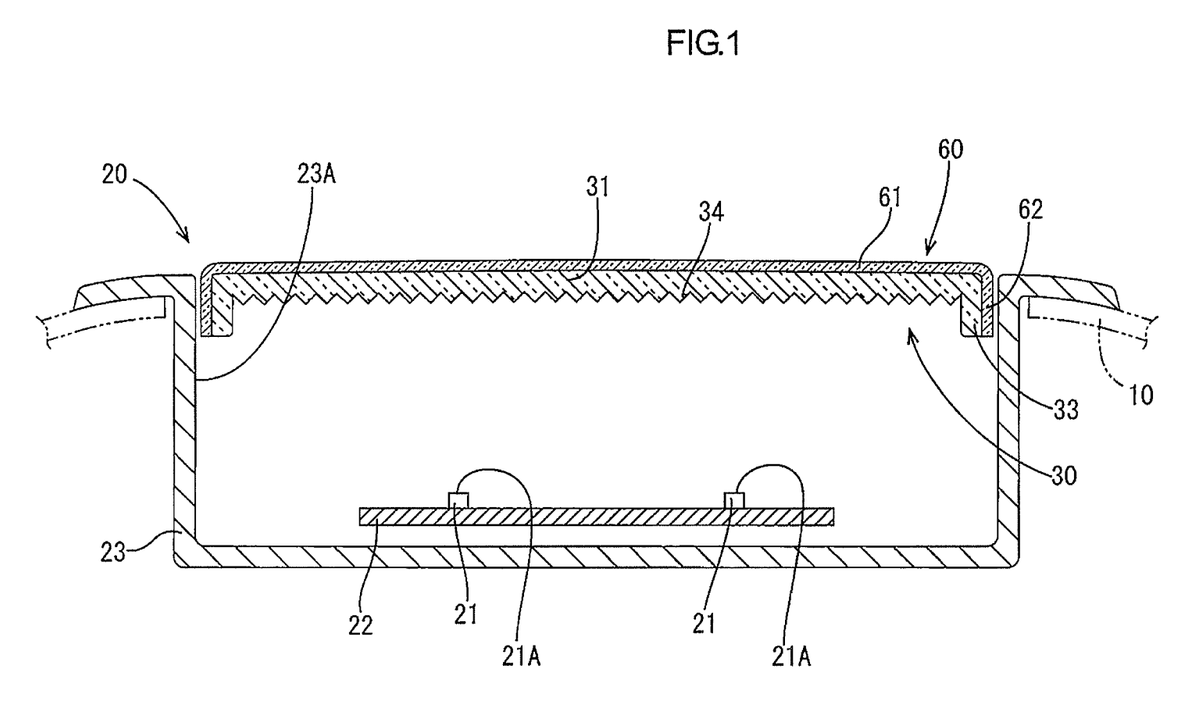
FIG. 1 is a cross-sectional view of a lighting device according to an embodiment.

An embodiment will be described with reference to FIGS. 1 to 8. As illustrated in FIG. 1, a lighting device 20 (a vehicle lighting device) may be attached to an interior ceiling 10 of a vehicle.

Figure 2:
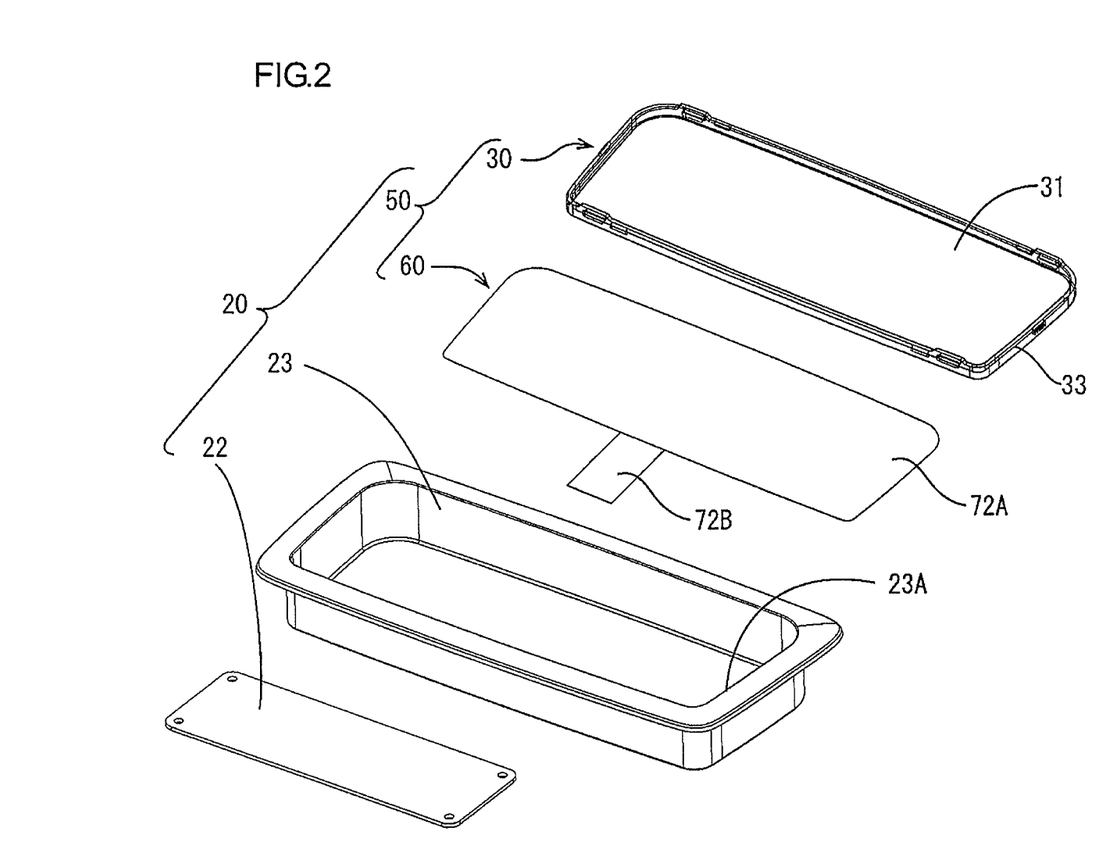
FIG. 2 is an exploded perspective view of the lighting device in FIG. 1.

As illustrated in FIGS. 1 and 2, the lighting device 20 includes LEDs 21 (light sources), a circuit board 22 on which the LEDs 21 are mounted, a case 23 (a light source housing), a covering member 50. The case 23 holds the LEDs 21 and the circuit board 22 therein. The covering member 50 includes a cover portion 30 and a sheet portion 60.

As illustrated in FIG. 1, the case 23 has a box-like shape with an opening 23A. As illustrated in FIG. 2, the case 23 has a rectangular shape in a plan view. The circuit board 22 on which the LEDs 21 are mounted is arranged on a bottom surface of the case 23.

The covering member 50 has a rectangular shape and attached to the case 23 so as to cover the opening 23A of the case 23. The covering member 50 is arranged to cover light exit surfaces 21A of the LEDs 21. The covering member 50 is fixed to the case 23 with detents, screws, or other fixing members.

The cover portion 30 is made of synthetic resin having high light transmissivity (i.e., high degree of clearness). Examples of the synthetic resin include acrylic, PET, and polycarbonate. The cover portion 30 is configured to pass light emitted by the LEDs 21 therethrough.

As illustrated in FIGS. 1 and 2, the cover portion 30 includes a rectangular main wall portion 31 and a peripheral wall portion 33. The peripheral wall portion 33 rises from edges (peripheral edges) of the main wall portion 31 toward the LEDs 21 (the lower side in FIG. 1). As illustrated in FIG. 2, the peripheral wall portion 33 extends for an entire perimeter of the main wall portion 31 at the edges of the main wall portion 31.

The main wall portion 31 includes a main surface of the covering member 50 (a designed surface, a surface on a vehicle interior side). The peripheral wall portion 33 includes a peripheral surface of the covering member 50.

As illustrated in FIG. 1, the main wall portion 31 has a back surface that includes a patterned surface 34 (a surface of the covering member on the light source side, a surface of the covering member without the sheet portion). A fine diamond-cut pattern (a raised and sunken pattern) is formed in the patterned surface 34. The patterned surface 34 may be prepared by surface treatment on the back surface of the main wall portion 31.

The patterned surface 34 has a function of diffusing light emitted by the LEDs 21. Namely, the back surface of the main wall portion 31 is an irregular surface that can diffuse the light emitted by the LEDs 21. Because of the patterned surface 34, the occupant is less likely to see an inside of the case 23 through the covering member 50. With this configuration, high quality is achieved in the interior design of the vehicle.

As illustrated in FIG. 1, the sheet portion 60 covers the top surface of the cover portion 30 (a surface of the cover portion 30 on the side away from the light source, a surface of the cover portion 30 on a vehicle interior side). Specifically, the sheet portion 60 includes a first sheet 61 and a second sheet 62. The first sheet 61 covers an entire surface of the main wall portion 31. The second sheet 62 covers an entire surface of the peripheral wall portion 33. The second sheet 62 rises from a peripheral edge of the first sheet 61 toward the LEDs 21.

The covering member 50 is prepared by insert molding. The cover portion 30 is welded to one of surfaces of the sheet portion 60 by insert molding. A material of the cover portion 30 and a material of the sheet portion 60 are combined into a single component by insert molding. As a result, the covering member 50 including the cover portion 30 and the sheet portion 60 is prepared. The patterned surface 34 may be formed by transferring a raised and sunken pattern on the mold onto the back surface of the main wall portion 31 during the insert molding.

Figure 4:
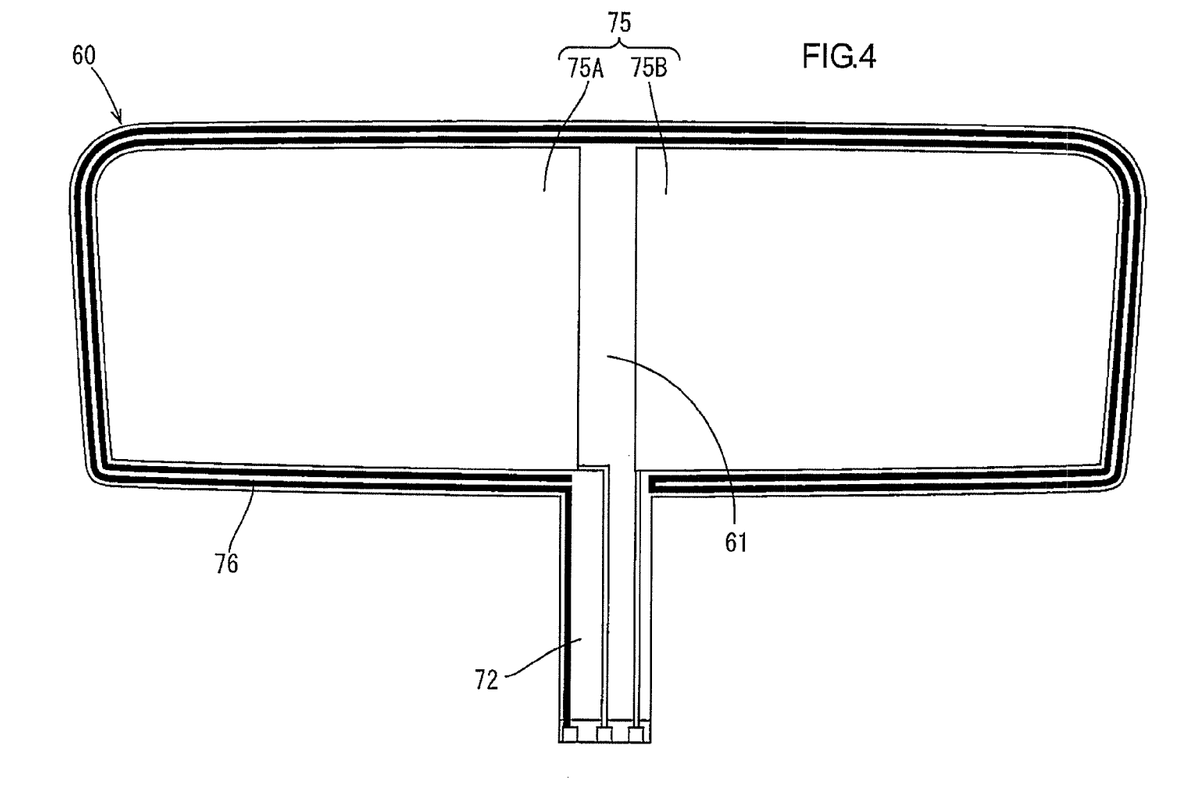
FIG. 4 is a plan view of the sheet portion before formed into a three dimensional shape.

As illustrated in FIG. 4, before the insert molding, the material of the sheet portion 60 has a flat shape. The material of the sheet portion 60 may be formed into a three-dimensional shape corresponding to the outline of the cover portion 30 by press working.

During the insert molding, the material of the sheet portion 60 is placed in a cavity for forming the cover portion 30 and the molten plastic is injected into the cavity to form the cover portion 30. As a result, the covering member 50 including the cover portion 30 and the sheet portion 60 is prepared.

Figure 5:
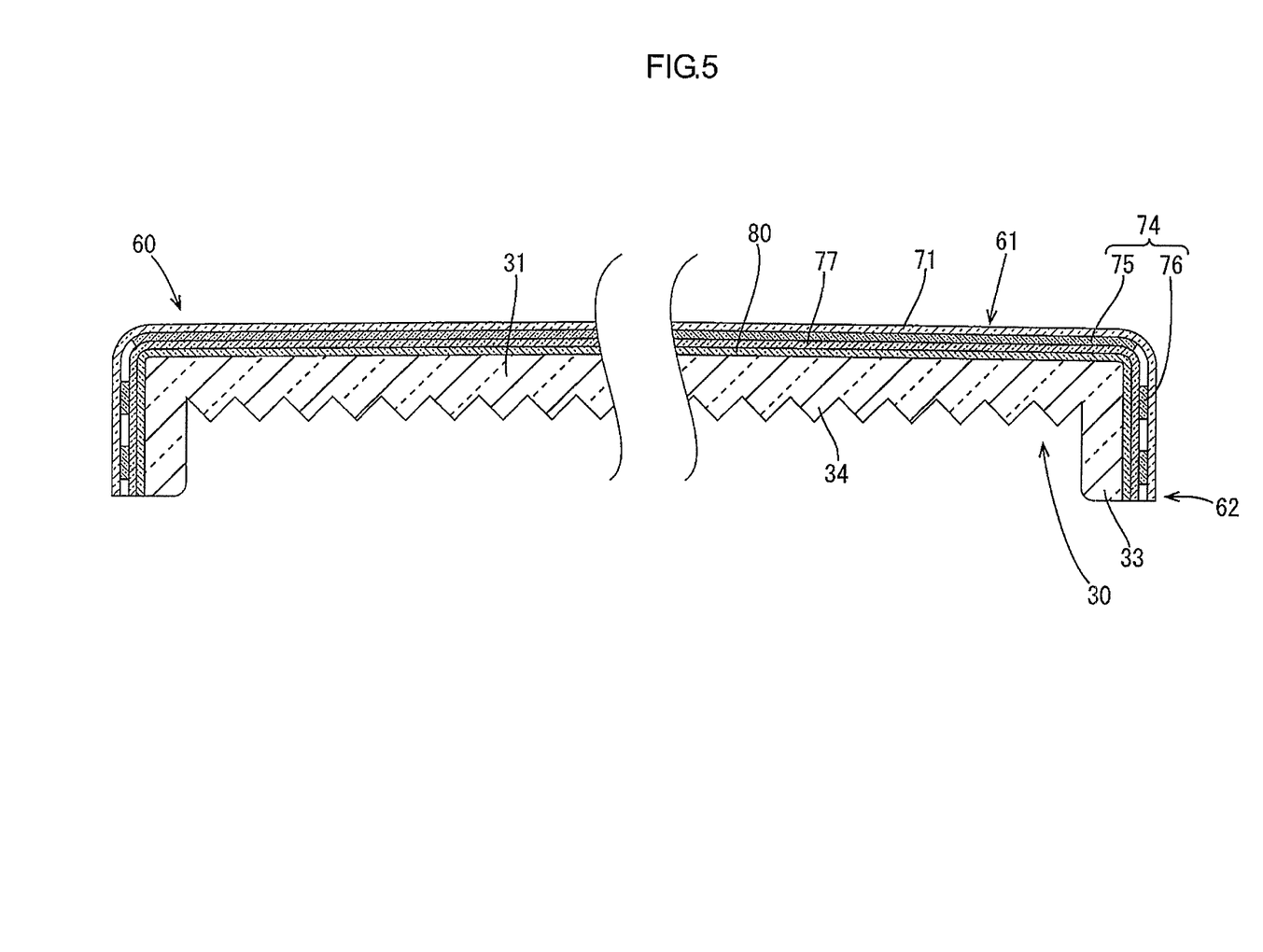
FIG. 5 is a cross-sectional view of a cover portion of the covering member and the sheet portion along line A-A in FIG. 3.
Figure 6:
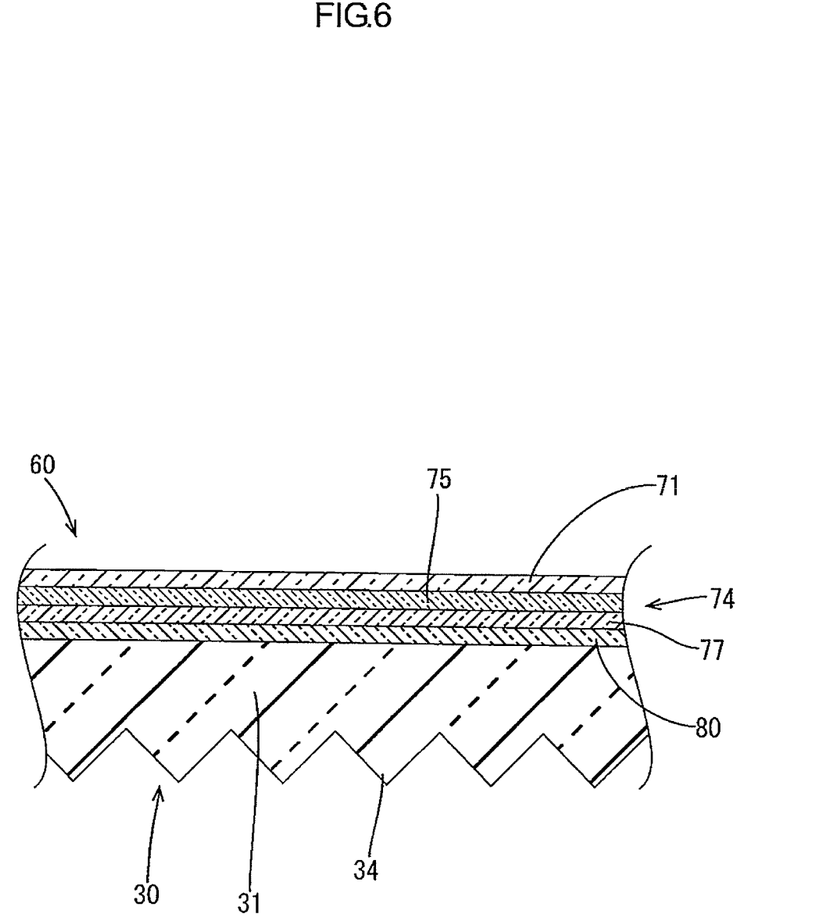
FIG. 6 is a magnified partial view of the covering member in FIG. 5.

Next, a configuration of the sheet portion 60 will be described. As illustrated in FIGS. 5 and 6, the sheet portion 60 includes a base layer 71, a transparent electrode layer 74 (an electrode layer), a protective layer 77, and a coupling layer 80 layered in this order from the top (the vehicle interior side, the upper side in FIG. 6). The base layer 71 and the protective layer 77 have electrical insulation properties.

The base layer 71 may be a film made of synthetic resin having light transmissivity (e.g., PET, polycarbonate). The base layer 71 is configured to pass the light from the LEDs 21 therethrough.

The transparent electrode layer 74 is formed by applying ink containing polythiophene conductive polymer to the back surface of the base layer. The base layer 71 is a layer that covers a surface of the transparent electrode layer 74 on the top side (a side away from the light source).

As illustrated in FIG. 5, the transparent electrode layer 74 is included in the first sheet 61. The transparent electrode layer 74 includes a first electrode layer 75 and a second electrode layer 76. The first electrode layer 75 is configured as a capacitive touch switch. The second electrode layer 76 is included in the second sheet 62. The first electrode layer 75 is in the main wall portion 31 and the second electrode layer 76 is in the peripheral wall portion 33.

Figure 3:
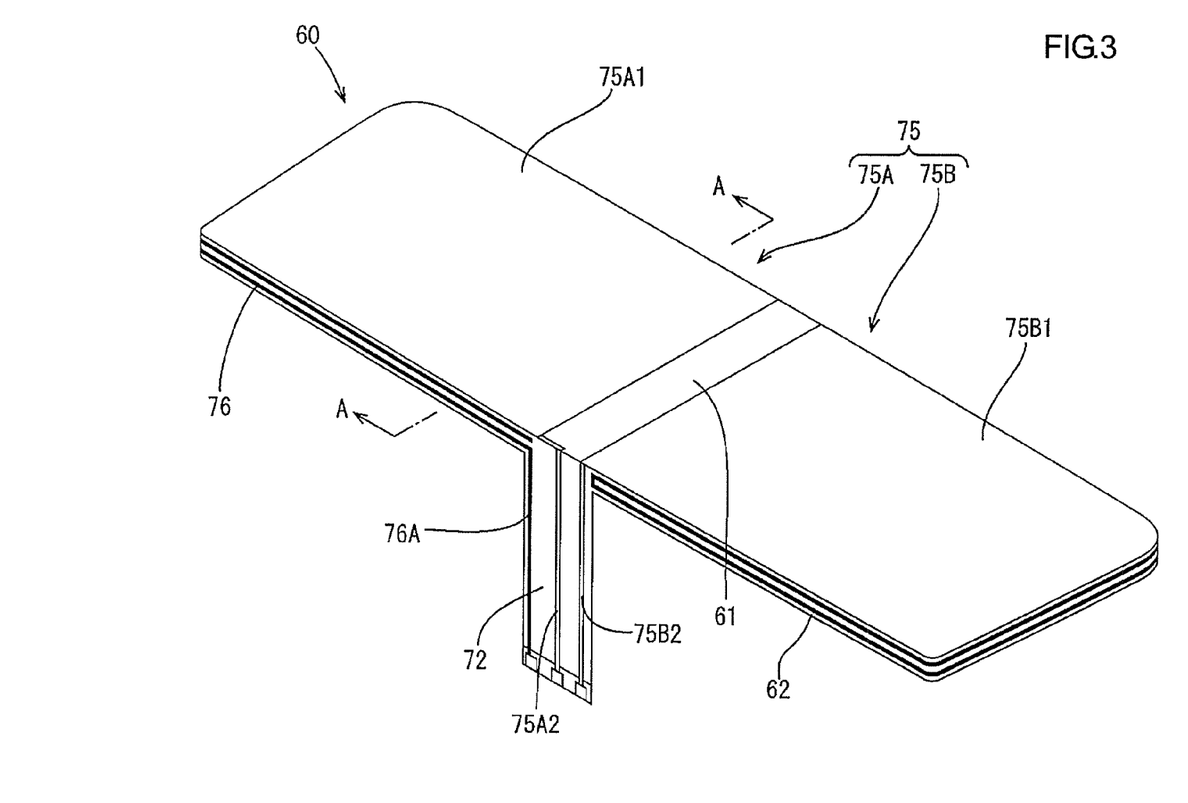
FIG. 3 is a perspective view of a sheet portion of a covering member.

As illustrated in FIGS. 3 and 4, the first electrode layer 75 is divided into two sections at about the center line with respect to the longitudinal direction thereof. The first electrode layer 75 includes a first section 75A and a second section 75B.

The first electrode layer 75 covers substantially an entire area of the main wall portion 31 except for a middle area of the main wall portion 31. As illustrated in FIGS. 2 and 3, the peripheral edge (outer edge) of the first electrode layer 75 extends along a boundary between the main wall portion 31 and the peripheral wall portion 33 (i.e., the peripheral edge of the main wall portion 31).

As illustrated in FIGS. 3 and 4, the second electrode layer 76 is in the form of a line. The second electrode layer 76 extends so as to surround the first electrode layer 75. Namely, the second electrode layer 76 extends for an entire perimeter of the peripheral wall 33.

The base layer 71 includes a main portion 72A an extended portion 72B that extends outward from the main portion 72A. The first electrode layer 75 includes a first main portion 75A1, a second main portion 75B1, a first extended portion 75A2, and a second extended portion 75B2. The first extended portion 75A2 and the second extended portion 75B2 extend from the first main portion 75A1 and the second main portion 75B1, respectively, along the extended portion 72B of the base layer 71. The second electrode layer 76 includes an extended portion 76A that extends along the extended portion 72B of the base layer 71. A distal end of the extended portion 72B of the base layer 71 is connected to a connector on the circuit board 22. With this configuration, the first electrode layer 75 and the second electrode layer 76 are electrically connected to a controller mounted on the circuit board 22.

The controller on the circuit board 22 is configured to detect a variation in capacitance which occurs when a human body (a finger) approaches the first electrode layer 75, and to determine whether the surface of the base layer 71 is touched. When the surface of the base layer 71 is touched, the controller turns on (or turns off) the LEDs 21. With this configuration, a touch switch function is added to the cover portion 30. Namely, the first electrode layer 75 functions as a detector of the touch switch.

In this embodiment, the first section 75A and the second section 75B of the first electrode layer 75 are configured as separate touch switches. Specifically, if a portion of the base layer 71 corresponding to the first section 75A is touched, the controller turns on the LED 21 arranged in an area corresponding to the first section 75A. If a portion of the base layer 71 corresponding to the second section 75B is touched, the controller turns on the LED 21 arranged in an area corresponding to the second section 75B. The operation by the touch switches is not limited to the turn on and off of the LEDs 21 and a technology using the touch switches can be applied to other operation.

The second electrode layer 76 is an electrode for absorbing ambient electric noises. With such an electrode, stability on operation of the touch switches can be improved. The second electrode layer 76 may be configured to function to absorb the electric noises according to control by the controller on the circuit board 22.

Longer the second electrode layer 76, more effective in electric noise absorption. As illustrated in FIGS. 3 and 4, a single line of the second electrode layer 76 is arranged so as to turn around at a point to provide a longer overall length, that is, about twice of the perimeter of the peripheral wall 33.

The second electrode layer 76 is in a form of a double line such that a single line form of the second electrode layer 76 is turned around to make the second electrode layer 76 in the form of a double line.

The protective layer 77 (a resist layer) covers a back surface (on the cover portion 30 side) of the transparent electrode layer 74. The protective layer 77 has light transmissivity and a function to protect the transparent electrode layer 74 by covering the transparent electrode layer 74. During the insert molding of the cover portion 30, the cover portion 30 in a molten state is at a high temperature. With the protective layer 77, the transparent electrode layer 74 is less likely to melt due to heat of the cover portion 30 and thus less likely to flows out.

The protective layer 77 may be made of material containing thermohardening resin. For example, the protective layer 77 may be formed by applying ink containing thermohardening resin to the back surface of the transparent electrode layer 74. However, a material of the protective layer 77 is not limited to the above material. Any material can be used as long as the protective layer 77 can protect the transparent electrode layer 74 from heat during the insert molding or other risk factors.

The coupling layer 80 (a binding layer) covers the back surface of the protective layer 77. As illustrated in FIG. 6, the coupling layer 80 is located between the protective layer 77 and the cover portion 30.

The coupling layer 80 has light transmissivity and a function for binding the protective layer 77 and the cover portion 30 together. Specifically, the coupling layer 80 is melted by the heat of the molten resin that is a material to form the cover portion 30 during the insert molding of the cover portion 30. The coupling layer 80 in a molten state binds the protective layer 77 and the cover portion 30 together.

A resin that has light transmissivity and high compatibility with the protective layer 77 and the cover portion 30 may be used for the coupling layer 80. A material of the coupling layer 80 may be selected according to materials of the protective layer 77 and the cover portion 30.

Next, effects will be described. As in a comparative example illustrated in FIG. 7, if a sheet 82 including a transparent electrode layer 71 is bonded to the back surface of the cover portion 30 (the surface including the patterned surface 34) with an adhesive 81, contact areas between the adhesive 81 and the cover portion 30 are small. Therefore, the adhesive power is low.

Figure 7:
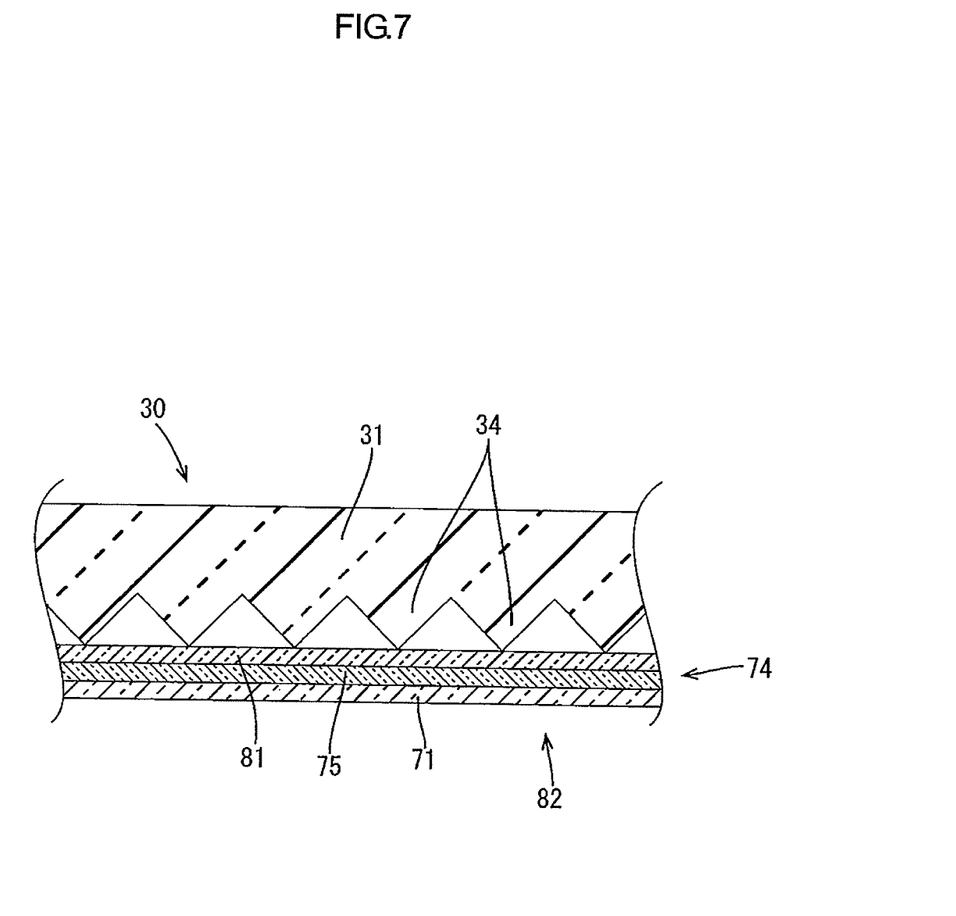
FIG. 7 is a cross-sectional view of a comparative example including a sheet is attached to a back surface of a covering member.

Further in the comparative example in FIG. 7, the patterned surface 34 directly touches the sheet 82 in some areas but air exists between the sheet 82 and the patterned surface 34 in areas where the patterned surface 34 does not directly touch the sheet 82. This causes variations in capacitance according to the areas and thus the sensitivity of the touch switch differs from area to area.

For that reason, bonding of the sheet portion 60 to the back surface of the cover portion 30 with an adhesive is not appropriate. Therefore, binding of the sheet portion 60 to the top surface of the cover portion 30 with an adhesive may be considered.

If the sheet portion 60 is bound to the top surface of the cover portion 30 with an adhesive, the sheet portion 60 is uncovered. Therefore, the sheet portion 60 is subject to external forces and more likely to come off in comparison to the configuration in which the sheet portion 60 is arranged on the back surface of the cover portion 30. In the configuration in which the adhesive is used, it is not appropriate to arrange the sheet portion 60 on the top surface of the cover portion 30.

In this embodiment, the cover portion 30 and the sheet portion 60 including the transparent electrode layer 74 are integrally formed by insert molding. Therefore, the sheet portion 60 is not removed from the cover portion 30 and thus the sheet portion 60 can be arranged on the top surface of the cover portion 30.

In this embodiment, the sheet portion 60 and the cover portion 30 are coupled by insert molding and thus the sheet portion 60 can be arranged on the top surface of the cover portion 30. Therefore, a transparent electrode layer is not required on the back surface of the cover portion 30. Even if the back surface of the cover portion 30 includes the patterned surface 34 (i.e., the back surface is not a flat surface), the transparent electrode layer 74 (touch switch electrode) can be attached to the cover portion 30. Namely, in this embodiment, the sheet portion 60 is prepared on the top surface of the cover portion 30 by insert molding and thus the back surface of the cover portion 30 can have the patterned surface 34.

The sheet portion 60 includes the base layer, the protective layer 7, and the coupling layer 80. The base layer 71 covers the surface of the transparent electrode layer away from the LEDs 21. The protective layer 77 covers the surface of the transparent electrode layer 74 on the LED 21 side and protects the transparent electrode 74. The coupling layer 80 is located between the protective layer 77 and the cover portion 30.

By arranging the transparent electrode layer 74 between the base layer 71 and the protective layer 77, the transparent electrode layer 74 can be adequately protected. Specifically, by providing the protective layer 77 between the transparent electrode layer 74 and the cover portion 30, the cover portion 30 in the molten state is less likely to directly contact the transparent electrode layer 74. Therefore, the transparent electrode layer 74 can be adequately protected.

In this embodiment, the second electrode layer 76 other than the first electrode layer 75 is included in the second sheet 62 that covers the peripheral wall portion 33 of the cover portion 30. The first electrode layer 75 and the second electrode layer 76 may be included in the first sheet 61. However, it is preferable to include the second electrode layer 76 in the second sheet 62.

Figure 8:
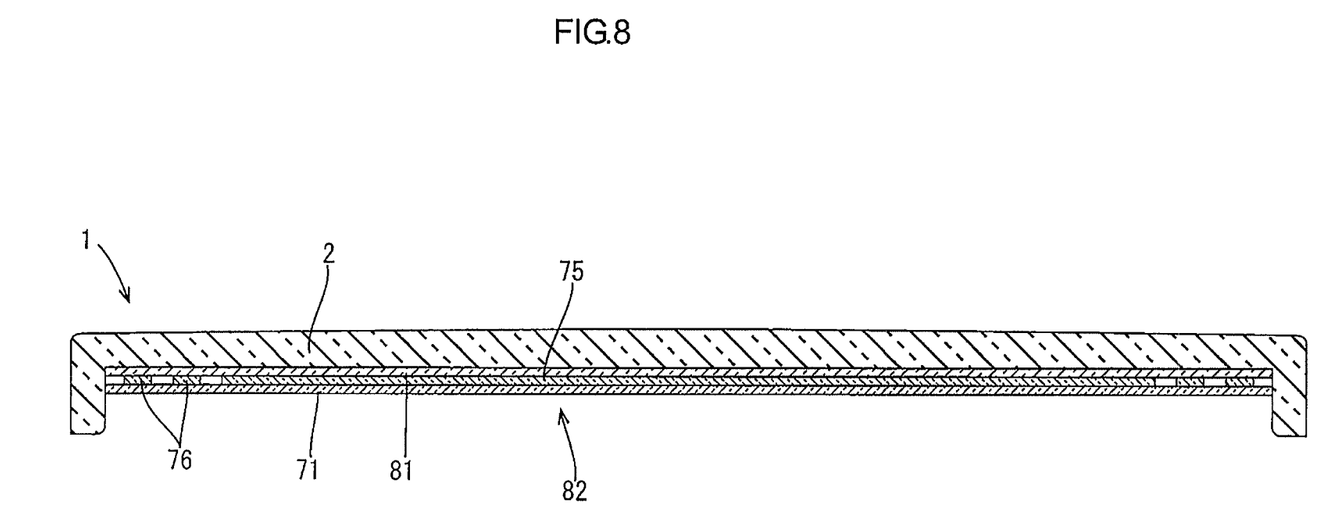
FIG. 8 is a cross-sectional view of a comparative example including a first electrode layer and a second electrode member formed on a main wall portion of a covering member.

The reason why it is preferable to include the second electrode layer 76 in the second sheet 62 will be described using a comparative example illustrated in FIG. 8. As in the above embodiment, if the second electrode layer 76 is configured as an electrode for electric noise absorption, it is preferable to form the second electrode layer 76 around the first electrode layer 75. As in the comparative example in FIG. 8, if the first electrode layer 75 and the second electrode layer 76 are both formed on a main wall portion 2 of a cover 1, the second electrode layer 76 is arranged in a peripheral edge portion of the main wall portion (portions close to right and left edges in FIG. 8). Therefore, the first electrode layer 75 cannot be arranged in the peripheral edge portion of the main wall portion 2. Namely, an area in which the first electrode layer 75 is formed cannot be expanded to the peripheral edge of the main wall portion 2.

In the above embodiment, the second electrode layer 76 is included in the second sheet 62 (on the peripheral wall 33 side). Namely, the first electrode layer 75 (the electrode of the capacitive touch switch) can be formed in a larger area on the main wall portion 31. Therefore, the occupant can properly touch an area corresponding to the first electrode layer 75, that is, operability of the touch switch can be improved.

In comparison to the configuration in which the first electrode layer 75 and the second electrode layer 76 are formed on the main wall portion 31, which is more likely to be viewed by the occupant, the appearance of the main wall portion 31 is simple. Therefore, the design quality improves.

In the above embodiment, the sheet portion 60 is formed into a three-dimensional shape so as to cover the main wall portion 31 and the peripheral wall portion 33. If the sheet portion 60 is attached to the cover portion 30 with an adhesive, the attachment of the sheet portion 60 to the cover portion 30 may be difficult in comparison to a configuration in which the sheet portion 60 is formed in a planar shape. In the above embodiment, the cover portion 30 is formed integrally with the sheet portion 60 by insert molding. Therefore, it is not required to attach the sheet portion 60 to the cover portion 30.

The peripheral edge (outer perimeter) of the first electrode layer 75 extends along the peripheral edge (outer perimeter) of the main wall portion 31.

By arranging the first electrode layer 75 such that the peripheral edge thereof extends along the peripheral edge of the main wall portion 31, a larger area is more easily provided on the main wall portion 31 for forming the first electrode layer 75. With this configuration, the occupant can more properly touch the area corresponding to the first electrode layer 75 (the detector of the touch switch). Therefore, the operation for turning on (or turning off) the LEDs 21 can be properly performed.

The peripheral wall portion 33 extends for an entire perimeter of the main wall portion 31. The second electrode layer 76 extends for an entire length of the peripheral wall portion 33. The second electrode layer 76 is arranged around the first electrode layer 75 and thus the noises can be effectively reduced.

The sheet portion 60 includes the base layer 71, the protective layer 77, and the coupling layer 80. The base layer 71 covers the surface of the transparent electrode layer 74 away from the LEDs 21. The protective layer 77 protects the transparent electrode layer 74. The coupling layer 80 is located between the protective layer 77 and the cover portion 30.

Because the transparent electrode layer 74 is arranged between the base layer 71 and the protective layer 77, the transparent electrode layer 74 is properly protected. Especially, because the protective layer 77 is provided between the transparent electrode layer 74 and the cover portion 30, the cover portion 30 in the molten state during insert molding is less likely to directly contact the transparent electrode layer 74. Therefore, the transparent electrode layer 74 is properly protected.

Other Embodiments

The technology described herein is not limited to the above embodiment described in the above description and the drawings. The technology described herein may include the following embodiments.

(1) The light source is not limited to the LED 21. The light source may include an LED (a main component of the light source) and a light guide member that guides light from the LED toward the interior of the vehicle. In the configuration in which the light source includes the light guide member, the light exit surface of the light source may be a light exit surface of the light guide member.

(2) The shape of the cover portion 30 is not limited to the rectangular in the plan view. The main wall portion 31 of the cover portion 30 may have a round shape and the peripheral wall portion 33 may have a ring shape that extends all around the cover portion 30. The cover portion 30 may not include the peripheral wall portion 33.

(3) The pattern in the patterned surface 34 is not limited to the diamond-cut pattern. The pattern may be altered as appropriate. The patterned surface 34 may include an embossed surface.

(4) The layers 71, 74, 77 and 80 of the sheet portion 60 may be altered as appropriated. The material of the transparent electrode layer 74 is not limited to PEDOT. The material of the transparent electrode layer 74 may be ITO. The transparent electrode layer 74 can be made of any material as long as the transparent electrode layer 74 has conductivity and light transmissivity. The transparent electrode layer 74 may be clear and colorless or clear and colored. The second electrode layer 76 on the peripheral wall 33 may not be clear.

Figure 9:
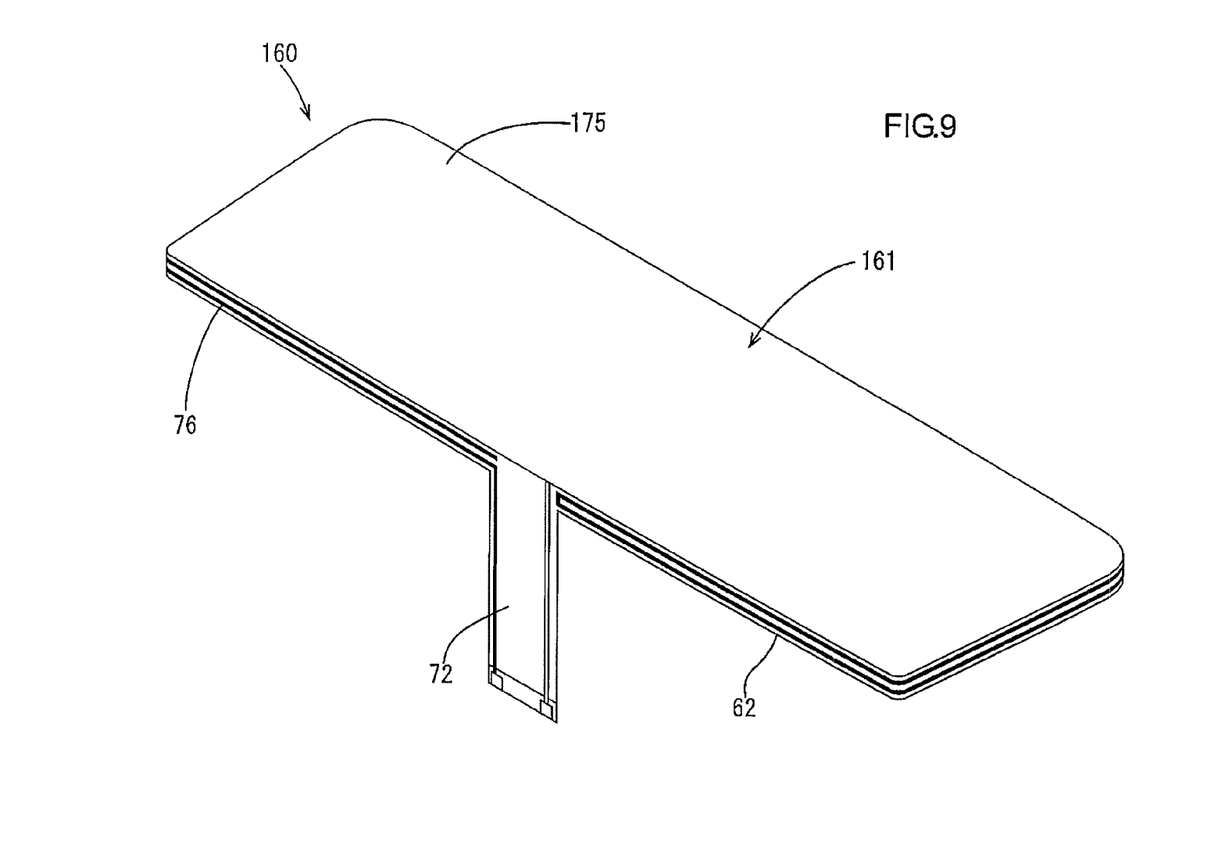
FIG. 9 is a perspective view of another example including a first electrode layer formed on an entire surface of a main wall portion of a covering member.

(5) The first electrode layer 75 may be configured differently. A sheet 160 illustrated in FIG. 9 may be used. The sheet 160 includes a first sheet 161 and a first electrode layer 175 that covers an entire surface of the first sheet 161. Namely, the first electrode layer 175 may cover an entire surface of the main wall portion 31. The peripheral edge of the first electrode layer 175 may be aligned to the peripheral edge of the main wall portion 31.

(6) A part of the first electrode layer 75 may extend so as to cover the peripheral wall portion 33.

(7) The lighting device 20 may be mounted to interior parts other than the interior ceiling 10. The lighting device 20 may be mounted to a door trim or an instrument panel of the vehicle.

(8) The function of the second electrode layer 76 is not limited to the electric noise absorption. The function may be altered as appropriate. The second electrode layer 76 may be configured as an electrode for the touch switch in the configuration in which the peripheral wall portion 33 of the cover portion 30 is uncovered.

(9) The cover portion 30 may not include the patterned surface 34.

The invention claimed is:

1. A vehicle lighting device comprising:
a light source;
a light source housing holding the light source therein, the light source housing having an opening; and
a cover attached to the light source housing, the cover covering the opening of the light source housing and passing light emitted by the light source, the cover including:
a transparent sheet including an electrode layer; and
a cover portion provided on a surface of the transparent sheet facing the light source, and provided on the light source housing to cover the opening of the light source housing and a light exit surface of the light source, a surface of the cover portion without the transparent sheet facing the light source.

2. The vehicle lighting device according to claim 1, wherein
the electrode layer has a first surface directed away from the light source and a second surface facing the light source, and
the transparent sheet further includes:
a base layer covering the first surface of the electrode layer;
a protective layer covering the second surface of the electrode layer and protecting the electrode layer; and
a coupling layer located between the protective layer and the cover portion.

3. The vehicle lighting device according to claim 1, wherein the surface of the cover portion without the transparent sheet includes a patterned surface.

4. The vehicle lighting device according to claim 1, wherein the electrode layer is a transparent electrode layer of a capacitive touch switch.

5. The vehicle lighting device according to claim 1, wherein
the cover portion includes:
a main wall including a main surface of the cover portion; and
a peripheral wall extending from a peripheral edge of the main wall toward the light source,
the transparent sheet includes:
a first sheet covering the main wall; and
a second sheet covering the peripheral wall, and
the electrode layer includes:
a first electrode layer comprising a transparent electrode of a capacitive touch switch included in the first sheet; and
a second electrode layer included in the second sheet and extending along the peripheral edge of the main wall.

6. The vehicle lighting device according to claim 5, wherein the first electrode layer has a peripheral edge that extends along the peripheral edge of the main wall.

7. The vehicle lighting device according to claim 5, wherein
the peripheral wall extends along an entire perimeter of the main wall at the peripheral edge of the main wall, and
the second electrode layer extends along an entire perimeter of the peripheral wall.

8. The vehicle lighting device according to claim 5, wherein
the transparent sheet further includes a base layer including a main portion and an extended portion that extends from the main portion,
the first electrode layer includes a first main portion, a second main portion, a first extended portion that extends from the first main portion along the extended portion of the base layer, and a second extended portion that extends from the second main portion along the extended portion of the base layer,
the second electrode layer includes an extended portion that extends along the extended portion of the base layer,
the base layer of the transparent sheet is connected to a circuit board including a controller, and
the first electrode layer and the second electrode layer are electrically connected to the controller of the circuit board.

9. The vehicle lighting device according to claim 8, wherein the second electrode layer is an electrode for electric noise absorption.

10. The vehicle lighting device according to claim 9, wherein at least a portion of the second electrode layer is in a form of a double line, in which a direction of a single line form of the second electrode layer is reversed to provide the double line.

11. The vehicle lighting device according to claim 10, wherein the second electrode layer has a length about twice a perimeter of the peripheral wall.

12. The vehicle lighting device according to claim 8, wherein
the light source includes a first light source and a second light source,
the capacitive touch switch includes:
a first touch switch corresponding to the first main portion of the first electrode layer and provided in a first half of the first sheet; and
a second touch switch corresponding to the second main portion of the first electrode layer and provided in a second half of the first sheet,
the first touch switch is configured to turn on and off the first light source, and
the second touch switch is configured to turn on and off the second light source.

13. The vehicle lighting device according to claim 12, wherein the first touch switch and the second touch switch are configured to turn on and off the first light source and the second light source independently from each other.

14. The vehicle lighting device according to claim 8, wherein the first main portion and the second main portion of the first electrode layer cover substantially an entire surface of the main wall of the cover portion.

15. The vehicle lighting device according to claim 2, wherein the protective layer comprises material containing thermohardening resin.

* * * * *